(12) United States Patent
Renault et al.

(10) Patent No.: US 8,513,043 B2
(45) Date of Patent: Aug. 20, 2013

(54) METHOD FOR MEMS DEVICE FABRICATION AND DEVICE FORMED

(75) Inventors: Mickael Renault, San Jose, CA (US); Joseph Damian Gordon Lacey, Milpitas, CA (US); Vikram Joshi, Mountian View, CA (US); Thomas L. Maguire, Sunnyvale, CA (US)

(73) Assignee: Cavendish Kinetics Inc., San Jose, CA (US)

( * ) Notice: Subject to any disclaimer, the term of this patent is extended or adjusted under 35 U.S.C. 154(b) by 0 days.

(21) Appl. No.: 13/349,696

(22) Filed: Jan. 13, 2012

(65) Prior Publication Data
US 2012/0181638 A1 Jul. 19, 2012

Related U.S. Application Data

(60) Provisional application No. 61/432,628, filed on Jan. 14, 2011.

(51) Int. Cl.
*H01L 21/00* (2006.01)

(52) U.S. Cl.
USPC .............. 438/52; 257/E21.001; 257/E21.499; 257/E23.181; 257/E23.182; 257/684; 438/48; 438/106; 438/121; 438/127; 438/689; 438/706; 438/761

(58) Field of Classification Search
USPC ................... 257/E23.181, E23.182, E21.001, 257/E21.499, 684; 361/600; 438/48, 52, 438/106, 121, 127, 689, 706, 761
See application file for complete search history.

(56) References Cited

U.S. PATENT DOCUMENTS

| | | | |
|---|---|---|---|
| 6,046,659 A | 4/2000 | Loo et al. | |
| 2007/0178703 A1* | 8/2007 | Partridge et al. | 438/706 |
| 2008/0297992 A1 | 12/2008 | Obata et al. | |
| 2009/0179287 A1* | 7/2009 | Inaba | 257/415 |
| 2009/0317930 A1* | 12/2009 | Charvet | 438/48 |
| 2011/0053321 A1* | 3/2011 | Huang | 438/127 |
| 2012/0075030 A1* | 3/2012 | Iwasaki et al. | 331/156 |
| 2012/0193732 A1* | 8/2012 | Chen et al. | 257/415 |

FOREIGN PATENT DOCUMENTS

| | | |
|---|---|---|
| WO | WO-/01/56920 A2 | 8/2001 |
| WO | WO-/2010/140792 A2 | 12/2010 |

OTHER PUBLICATIONS

International search report and written opinion for PCT/US2012/021218 dated Jul. 10, 2012.
Invitation to pay additional fees and Partial International Search Report for PCT/US2012/02128 dated May 29, 2012.

* cited by examiner

*Primary Examiner* — Asok K Sarkar
(74) *Attorney, Agent, or Firm* — Patterson & Sheridan, LLP

(57) ABSTRACT

The present invention generally relates to methods for producing MEMS or NEMS devices and the devices themselves. A thin layer of a material having a lower recombination coefficient as compared to the cantilever structure may be deposited over the cantilever structure, the RF electrode and the pull-off electrode. The thin layer permits the etching gas introduced to the cavity to decrease the overall etchant recombination rate within the cavity and thus, increase the etching rate of the sacrificial material within the cavity. The etchant itself may be introduced through an opening in the encapsulating layer that is linearly aligned with the anchor portion of the cantilever structure so that the topmost layer of sacrificial material is etched first. Thereafter, sealing material may seal the cavity and extend into the cavity all the way to the anchor portion to provide additional strength to the anchor portion.

15 Claims, 3 Drawing Sheets

METHOD FOR MEMS DEVICE FABRICATION AND DEVICE FORMED

CROSS-REFERENCE TO RELATED APPLICATIONS

This application claims benefit of U.S. provisional patent application Ser. No. 61/432,628, filed Jan. 14, 2011, which is herein incorporated by reference.

BACKGROUND OF THE INVENTION

1. Field of the Invention

Embodiments of the present invention generally relate to a method of release etching a micro-electromechanical system (MEMS) or nano-electromechanical system (NEMS) contained in a cavity.

2. Description of the Related Art

The key part of any MEMS or NEMS fabrication process is the release of the structure from the surrounding sacrificial material to thereby enable motion of the structure within the cavity. The step of the sacrificial material removal is also called sacrificial etching or release etching. The sacrificial etching or releasing etching is critical from a technological and economical point of view.

On the technical side, the device may easily break during the sacrificial etching or release etching. On the economical side, the release etch step is often the longest step in the manufacturing process with release etching time lasting up to a few hours per wafer. The long etching time results in a low throughput rate and is very likely to hurt the cost per unit if the cost of ownership of the release equipment is high or if additional capital expenditures are required.

Therefore, there is a need in the art for a method of release etching a MEMS or NEMS contained within a cavity and for a stable device manufactured using such a method.

SUMMARY OF THE INVENTION

The present invention generally relates to methods for producing metal MEMS or NEMS devices and the devices themselves. A thin layer of a material having a lower recombination coefficient as compared to the cantilever structure may be deposited over the cantilever structure, the RF electrode and the pull-off electrode. The thin layer decreases the overall etchant recombination rate of the etchant gas within the cavity, and thus increases the etching rate of the sacrificial material within the cavity. The etchant itself may be introduced through an opening in the encapsulating layer that is linearly aligned with the anchor portion of the cantilever structure so that the topmost layer of sacrificial material completes the etching process first. Thereafter, sealing material may seal the cavity and extend into the cavity all the way to the anchor portion to provide additional strength to the anchor portion.

In one embodiment, a device includes a substrate having one or more vias extending therethrough that are filled with an electrically conductive material that is electrically connected to one or more layers below the substrate. The device also includes a wall coupled to the substrate and extending in a direction perpendicular to a top surface of the substrate and a roof coupled to the wall such that the wall, roof and substrate collectively enclose a cavity. The device additionally includes a cantilever structure enclosed within the cavity, movable within the cavity, and coupled to the electrically conductive material. The cantilever structure comprises a multilayer structure having a first layer of a material that has a first recombination coefficient and a second layer that faces the roof. The second layer comprises a material that has a second recombination coefficient that is lower than the first recombination coefficient.

In another embodiment, a method includes depositing a first insulating layer over a substrate, etching the first insulating layer to expose at least a portion of the substrate and form a via, depositing a first sacrificial layer over the first insulating layer, and etching the first sacrificial layer to at least partially define outer boundaries for a cavity to be formed and to expose the substrate through the via. The method also includes depositing a structural layer on the substrate and on the first sacrificial layer. The structural layer comprises a material having a first recombination coefficient. The method also includes etching the structural layer to at least partially define the shape of a cantilever device and expose at least a portion of the first sacrificial layer and depositing a second insulating layer on the structural layer. The second insulating layer comprises a material having a second recombination coefficient that is lower than the first recombination coefficient. The method also includes etching the second insulating layer and the structural layer to at least partially define the shape of the cantilever device and to expose at least a portion of the first sacrificial layer, depositing a second sacrificial layer on the first sacrificial layer and on the second insulating layer, etching the second sacrificial layer such that the first sacrificial layer and the second sacrificial layer collectively define the shape of the cavity to be formed, and depositing a third insulating layer over the second sacrificial layer. The method additionally includes depositing an electrode layer on the third insulating layer, depositing an encapsulating layer on the electrode layer, etching an opening in the encapsulating layer, introducing an etchant through the opening, and etching the first sacrificial layer and the second sacrificial layer to remove the first sacrificial layer and the second sacrificial layer, to form the cavity and free the cantilever device to move within the cavity.

In another embodiment, a method includes depositing a first sacrificial layer over a substrate, removing material from the first sacrificial layer to form a via and expose at least a portion of the substrate, forming a cantilever structure over the first sacrificial layer and within the via, depositing a second sacrificial layer over the cantilever structure, and depositing an encapsulating layer over the second sacrificial layer, first sacrificial layer and the substrate to form at least a portion of a cavity boundary. The method additionally includes removing at least a portion of the encapsulating layer to expose the second sacrificial layer and form an opening that is axially aligned with the via, introducing an etching gas to the second sacrificial layer through the opening, and etching the second sacrificial layer and the first sacrificial layer to form a cavity and free the cantilever structure within the cavity.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
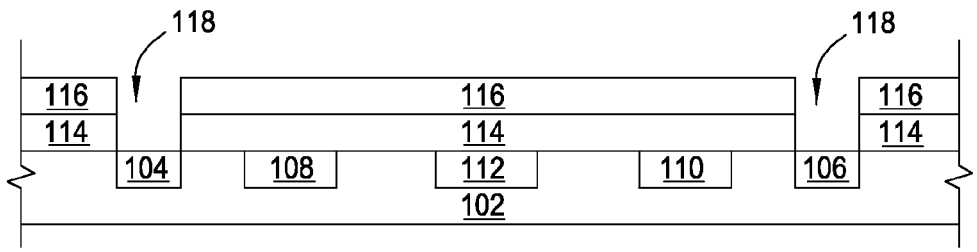
FIGS. 1A-1I are schematic cross-sectional views of a MEMS device at several stages of processing.

The present invention generally relates to methods for producing MEMS or NEMS devices and the devices themselves. A thin layer of a material having a lower recombination coefficient as compared to the cantilever structure may be deposited over the cantilever structure, the RF electrode and the pull-off electrode. The thin layer decreases the overall etchant recombination rate of the etchant gas within the cavity, and thus increases the etching rate of the sacrificial material within the cavity. The etchant itself may be introduced through an opening in the encapsulating layer that is linearly aligned with the anchor portion of the cantilever structure so that the topmost layer of sacrificial material completes the etching process first. Thereafter, sealing material may seal the cavity and extend into the cavity all the way to the anchor portion to provide additional strength to the anchor portion.

One overall problem with cantilever devices containing metal portions enclosed within cavities is that the cavity as well as the enclosed device has a large fractional area made of metal. If the sacrificial material is an organic material and the release chemistry used is hydrogen and/or oxygen based, the etching ions may recombine due to interaction with the metal surfaces and thus lower the etching rate. The design here involves spacing apart all uncoated metal or metal nitride surfaces as much as possible within design/device constraints.

FIGS. 1A-1I are schematic cross-sectional views of a MEMS device at several stages of processing. The device includes a substrate 102. The substrate 102 is shown as a generic substrate, but it is to be understood that the substrate may be a single layer material such as a semiconductor wafer or a multiple layer structure such as a complementary metal oxide semiconductor (CMOS) device. For a single layer material, the device may be built and then attached to a device such as a CMOS device.

Embedded within the substrate 102 are several structures. There are electrical connections/contacts 104, 106 that provide electrical connection from the device to layers below the substrate 102. There are also pull-in electrodes 108, 110 that are used to pull the device from a position spaced a first distance from the RF electrode 112 to a second distance closer to the RF electrode 112. The electrical connections 104, 106, pull-in electrodes 108, 110 and the RF electrode 112 may all be formed by removing material from the substrate 102 by a process such as etching, blanket depositing an electrically conductive material, and removing excess electrically conductive material by a process such as etching or chemical mechanical polishing. Suitable electrically conductive material that may be used include copper, aluminum, titanium, tungsten, titanium nitride, titanium aluminum nitride, and combinations thereof. The substrate material that the electrically conductive material is formed within may include electrically insulating material such as silicon oxide, silicon nitride, silicon oxynitride, and combinations thereof. Alternatively, the electrical connections 104, 106, pull-in electrodes 108, 110 and the RF electrode 112 may all be formed by first blanket depositing an electrically conductive material over the substrate 102. Thereafter, excess portions of the electrically conductive material are removed by a process such as etching to form the final shape of the electrical connections 104, 106, pull-in electrodes 108, 110 and the RF electrode 112. Thereafter, an electrically insulating material may be deposited over the exposed substrate 102 and electrical connections 104, 106, pull-in electrodes 108, 110 and the RF electrode 112 by a blanket deposition process. Excess electrically insulating material may then be removed by a process such as etching or CMP.

Design constraints or material-related MEMS characteristics make it difficult to change either the cavity or the MEMS material. However, recombination being a surface phenomena, one may work to reduce the recombination coefficient of some encountered surfaces. This could be achieved by coating some critical surfaces with a material having a low recombination coefficient for the etchants involved. Considering hydrogen or oxygen radicals as etchants, an effective recombination inhibitor will typically be an insulating material or a material with saturated lattice bonds. These include, but are not limited to, silicon nitride, silicon oxide, silicon oxynitride as well as some insulating metal oxide (aluminum oxide, titanium oxide, hafnium oxide) or insulating metal nitride (aluminum nitride).

The electrically conductive material may have a different recombination coefficient than the electrical insulating material. As such, during an etching process to remove sacrificial material from the cavity, the etching radicals may recombine when exposed to the electrically conductive material. Because the radicals recombine, the etching rate decreases and throughput suffers. Therefore, an electrically insulating layer 114 is deposited over the substrate 102 as well as the electrical connections 104, 106, the pull-in electrodes 108, 110 and the RF electrode 112. The electrically insulating layer 114 has a thickness of between about 100 nm and about 225 nm. In one embodiment, the thickness may be between about 175 nm and about 210 nm. The insulating layer 114 needs to be thin enough to permit the pull-in electrodes 108, 110 as well as the RF electrode 112 to function properly. The thickness of insulating layer 114 and the material chosen for the insulating layer 114 is driven by the capacitance requirements of the device. Suitable electrically insulating material that may be utilized include silicon nitride, silicon oxide or combinations thereof. It is contemplated that other electrically insulating material may be utilized as well so long as the electrically insulating material has a much slower etch rate than the sacrificial material that will be formed and removed thereover.

Over the electrically insulating layer 114, a sacrificial layer 116 may be deposited. The sacrificial layer 116 is a layer that is used to help define not only the shape of the cantilever device, but also the shape of the cavity in which the device is formed. Suitable materials that may be used for the sacrificial layer 116 include silicon containing compounds such as amorphous silicon, silicon dioxide, silicon nitride, silicon oxide, silicon oxynitride, spin-on glass or spin on dielectric containing a long chain molecule with a carbon backbone, and combinations thereof. It is important that the material chosen for the electrically insulating layer 114 and the material selected for the sacrificial layer 116 have different etch rates so that the sacrificial layer 116 will be removed without removing too much material from the electrically insulating layer 114. The sacrificial layer 116 may be deposited by methods including atomic layer deposition (ALD), chemical vapor deposition (CVD), physical vapor deposition (PVD), spin coating and other well known deposition methods. After deposition, the sacrificial layer 116 may then be exposed to a high temperature to anneal or cure the sacrificial layer 116.

Vias 118 are then formed through the sacrificial layer 116 and the electrically insulating layer 114 to expose at least a portion of the electrical connections 104, 106. The vias 118 may be formed by placing or forming a mask over the sacrificial layer 116 and then etching through the mask openings to remove material. It is to be understood that the insulating layer 114 may be etched prior to deposition of the sacrificial layer 116 if desired by using a technique as discussed above. The resulting structure is shown in FIG. 1A.

Figure 1B:
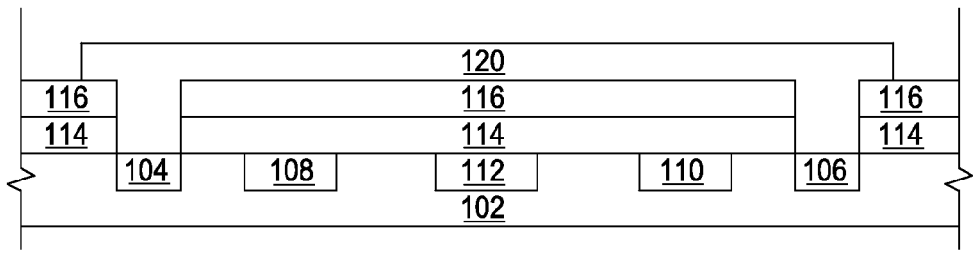

Following formation of the vias 118, material for a first structural layer 120 of the cantilever device is deposited. The material is deposited into the vias 118 onto the exposed electrical contacts 104, 106 to provide an electrical connection to the device. The material, after deposition, is shaped to form the desired final structure for the first structural layer. The material is shaped by depositing or forming a mask thereover and then etching exposed material. The mask is then removed leaving the first structural layer 120 as shown in FIG. 1B. Suitable materials that may be used for the first structural layer include titanium nitride, titanium aluminum, tungsten, copper, titanium aluminum nitride aluminum and combinations thereof and multilayer structures such as titanium nitride-aluminum-titanium nitride. The material for the first structural layer 120 may be deposited by a suitable deposition process such as PVD.

Because sacrificial material that is formed over the first structural layer 120 will be removed, the first structural layer 120 may be exposed to etchant during the removal process. The material for the first structural layer 120 may permit recombination of the etching radicals and thus, reduce the etching rate and decrease throughput. Similar to the insulating layer 114 discussed above, a second insulating layer 122 may be deposited over the first structural layer 120 such that the second insulating layer 122 has a lower recombination coefficient as compared to the first structural layer 120. The depositing methods and materials that are suitable for insulating layer 114 are suitable for the second insulating layer 122 as well, although the materials and material thicknesses need not be identical. The second insulating layer 122 is then etched to remove material that is not covering the first structural layer 120 and to exposes portions of the first sacrificial layer 116. Vias may be etched through the second insulating layer 122 at this time if desired or may be etched following formation of the second sacrificial layer 124.

Figure 1C:
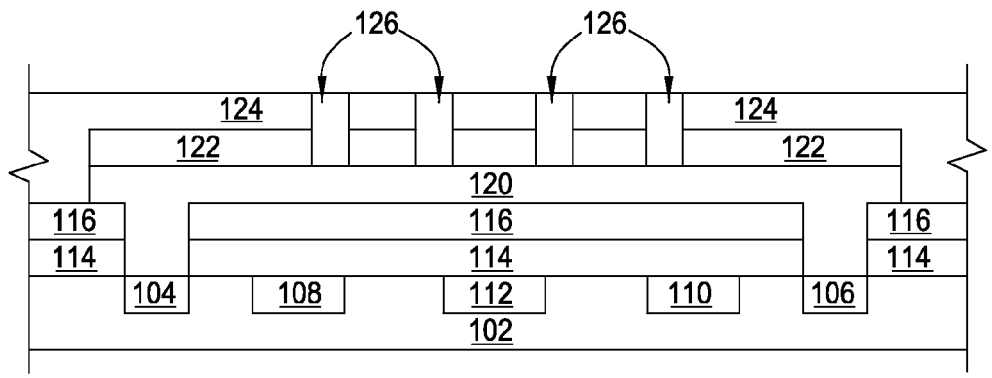

The second sacrificial layer 124 may then be formed over both the second insulating layer 122 and the exposed first sacrificial layer 116. The second sacrificial layer 124 may comprise materials as discussed above with regards to the first sacrificial layer 116 and be formed by similar methods. However, it is to be understood that the methods and material for layers 116, 124 need not be identical. The second sacrificial layer 124 is etched to define at least a portion of the boundary for the cavity and to at least partially define the shape of the next structural layer to be formed. Vias 126 may be etched through the second sacrificial layer 124 (as well as the second insulating layer if not already formed) to expose the first structural layer 120 as shown in FIG. 1C. The vias 126 will eventually be filled with material that will support the next structural layer and provide electrical connection between the structural layers.

Figure 1D:
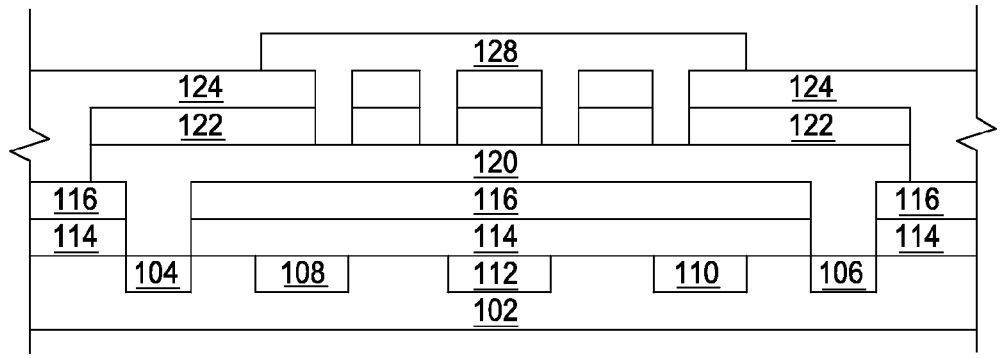

Within the vias 126 and over the second sacrificial layer 124, material forming the second structural layer 128 is deposited. The material is shaped to form the desired final structure of the second structural layer 128 as shown in FIG. 1D. The material within the vias 126 forms posts to space the second structural layer 128 from the first structural layer 120 and create a waffle-like structure. Suitable deposition methods and materials that may be used include those discussed above with regards to first structural layer 120. It is to be understood that the material and deposition methods used for the first structural layer 120 and the second structural layer 128 need not be identical. Because sacrificial material that is formed over the second structural layer 128 will be removed, the second structural layer 128 may be exposed to etchant during the removal process. The material for the second structural layer 128 may permit recombination of the etching radicals and thus, reduce the etching rate and decrease throughput. Similar to the insulating layer 114 discussed above, a third insulating layer 129 may be deposited over the second structural layer 128 such that the third insulating layer 129 has a lower recombination coefficient as compared to the second structural layer 128.

Figure 1E:
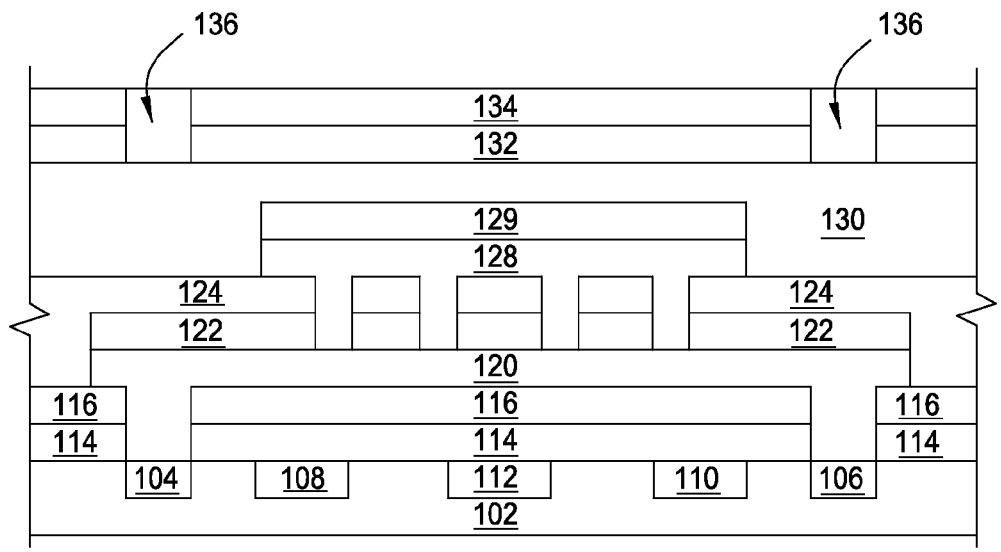

Similar to both the first and second insulating layers 114, 122, the third insulating layer 129 has a lower recombination coefficient as compared to the second structural layer 128. Suitable materials and deposition methods that may be used include the methods and materials discussed above with regards to the first and second insulating layers 114, 122. It is to be understood that the methods and materials for the insulating layers need not be identical. The third insulating layer 129 and the second structural layer 128 are etched to form the final cantilever shape as shown in FIG. 1E and expose the second sacrificial layer 124.

A third sacrificial layer 130 is then formed over the exposed second sacrificial layer 124 and the third insulating layer 129. Suitable deposition methods and materials as are described above for the first and second sacrificial layers 116, 124 may be used, although, the methods and materials need not be identical. The final shape of the first sacrificial layer 116, the second sacrificial layer 124 and the third sacrificial layer 130 collectively define the shape of the cavity to be formed.

A fourth insulating layer 132 is then deposited over the third sacrificial layer 130. The fourth insulating layer 132 is used to protect the pull-off electrode from exposure to the etching ions that are used to remove the sacrificial material. Thus, the fourth insulating layer 132 may be fabricated by a process and of a material as described above with regards to the first, second and third insulating layers 114, 122, 129. However, it is to be understood that the methods and materials for the insulating layers need not be identical.

An electrically conductive layer is then deposited over the fourth insulating layer 132 to form the pull-off electrode 134. While not shown, the pull-off electrode 134 may be electrically connected to layers either below the substrate 102 or above the pull-off electrode 134. Vias 136 may then be etched through both the pull-off electrode 134 as well as the fourth insulating layer 132. The vias 136 are formed so that they are linearly aligned with the electrical contacts 104 as shown in FIG. 1E. As will be discussed below, having the vias 136 linearly aligned with the electrical contacts 104, 106 assist in increasing the structural integrity of the device.

An etching gas may then be introduced through the vias 136. In order to get the highest possible etch rate for a given release hole, the release chemistry may be optimized. Adding oxygen to the etching gas was seen to have a valuable impact on the release etch rate. It has been found that utilizing a higher pressure and up to 10 percent diatomic oxygen in the etching gas could improve etching rates for carbon based sacrificial material such as PolyArylene Ether (PAE) based sacrificial materials. This could be explained by multiple reasons such as faster etch rate at a given partial pressure (lower activation energy of the limited step), etchant yield increase through positive catalyzing action with the hydrogen plasma, or partial passivation of the metal surface limiting the recombination rate of hydrogen and/or oxygen on metal surfaces.

During the etching process, the etchant consists of molecular hydrogen or oxygen. These species are generated at low to medium pressure by a plasma reactor. At the pressure involved (i.e., about 1 mTorr to about 50 mTorr), the mean free path is large when compared to any critical dimension of the cavity. This means that atom-atom collisions in the gas phase (H+H->H2) are a rare event and does not lead to a depletion of atomic species. On the other hand, atom-surface collisions are extremely frequent and the outcome off the collision is determined by the surface's nature. Consider, for example, an etchant E (E being hydrogen (H) or oxygen (O)) and a surface S. Atom-surface collisions will lead to the adsorption of the etchant on the surface: $E+S\text{->}E_{ads}$. On the sacrificial layer surface, adsorbed etchants react on the organic material and etch it ($C_xN_yH_zO(s)+H_{ads}$ and/or $O_{ads}\text{->}CH_4(g)$, $NO(g)$, $NO_2(g)$, $CO_2(g)$, $H_2O(g)$, etc.)

On a metal surface, adsorbed etchants potentially recombine ($E_{ads}\text{->}E_2+2S$). The efficiency at which recombination occurs on surfaces can be characterized by the recombination coefficient. The higher the recombination coefficient, the greater is the loss of atomic etchants. This ultimately leads to a reduction of the flux of available etchants and hence, a decrease in sacrificial etch rate. Metals on which hydrogen and/or oxygen recombine include, but are not limited to, copper, platinum, titanium, titanium nitride, alloys of titanium aluminum ($Ti_xAl_y$), alloys of titanium aluminum nitride ($Ti_xAl_yN$), tantalum nitride, chromium, and tungsten.

Etching the cavity is one of the longest processing steps and is limited by the loss of active etch ions at the metal surfaces. The insulating layer over the metal surface solves the problem. The etch holes at the top permit removal of the top sacrificial layer first because by removing the top sacrificial layer before the bottom sacrificial layer, the device is not stuck to the roof during the release. The roof of the cavity may bend up during the release because the release is a hot process. If the MEMS device were release bottom first with the top still attached to the roof, then the movement of the cavity could destroy the vias holding the MEMS device to the electrical contacts below. By releasing the top first, the problem is solved. The etch holes are positioned so that they are above the MEMS vias underneath. Then, when filed with material, the filling adds to the strength of the MEMS device held at each end.

Figure 1F:
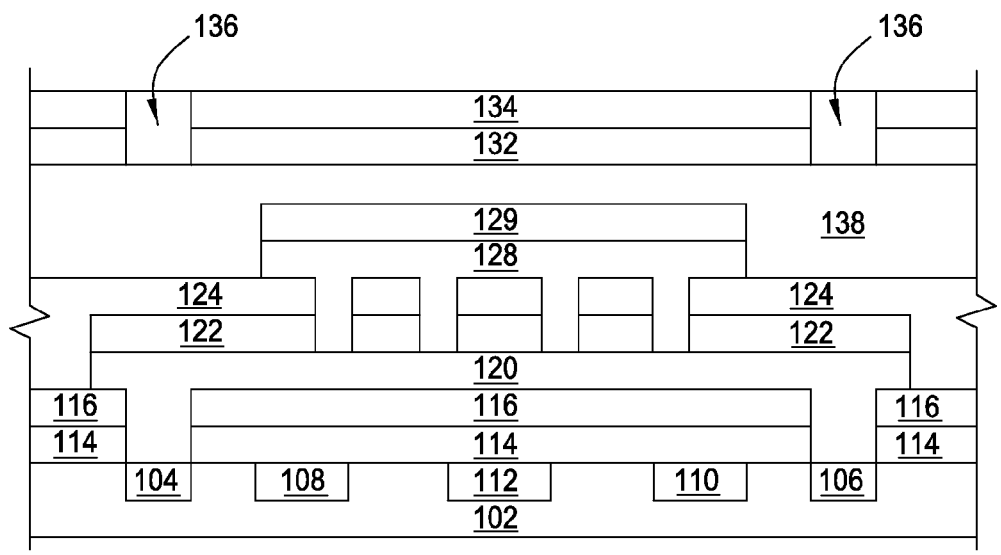

Because of the location of the vias 136, the third sacrificial layer 130 will be removed first to begin to form the cavity as shown in FIG. 1F. Removing the third sacrificial layer 130 first permits the third insulating layer 129 to be spaced from the fourth insulating layer 132 and not directly connected. During the etching, the temperature and even the pressure within the cavity 138 may increase and cause an expansion of the fourth insulating layer 132 and pull-off electrode 134. If the third sacrificial layer 130 is removed last, then the device may be damaged during any expansion.

Figure 1G:
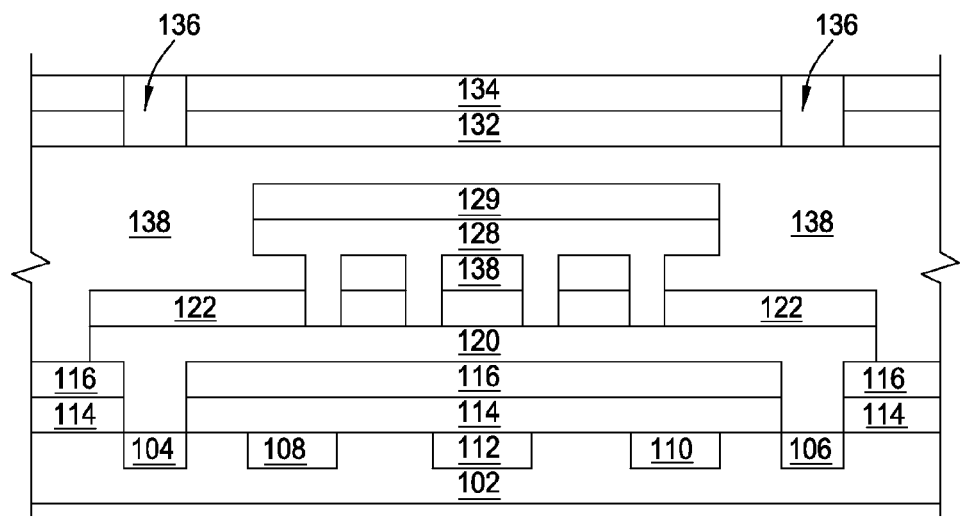
Figure 1H:
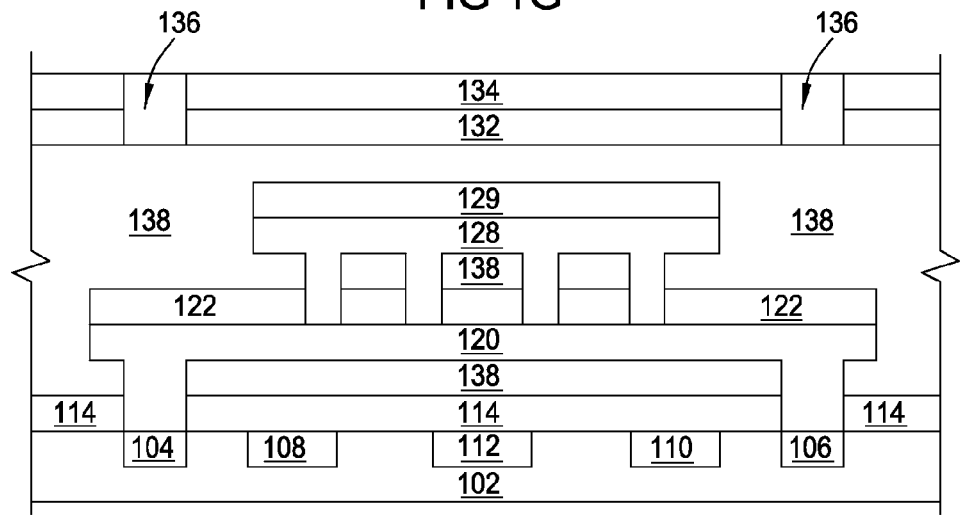
Figure 1I:
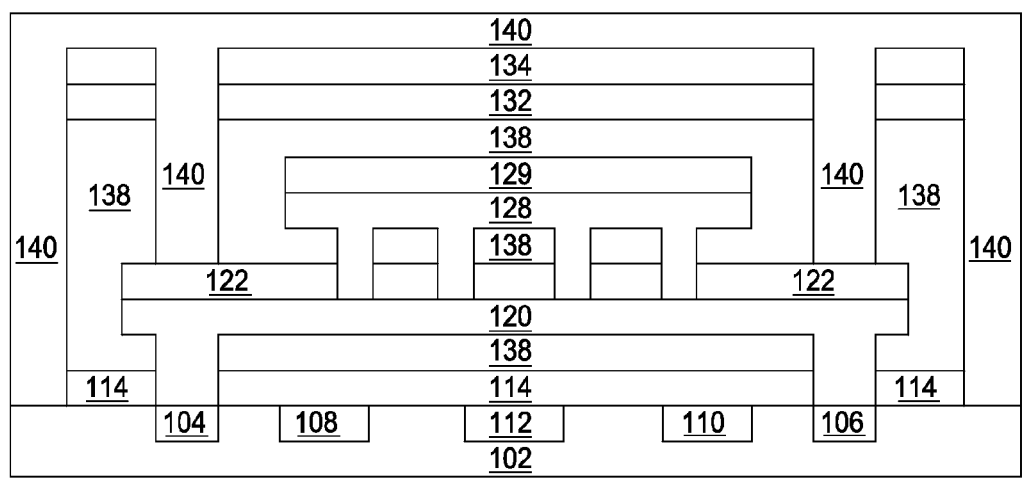

Thereafter, the second sacrificial layer 124 is removed as shown in FIG. 1G and the first sacrificial layer 116 is removed to completely form the cavity 138 and free the device as shown in FIG. 1H. A sealing material 140 may then be deposited to seal the vias 136 and even fill the vias 136 such that the sealing material is deposited on the exposed second insulating layer 122. The sealing material 140 thus not only seals the cavity 138 but also provides additional structural support to the device. The sealing material 140 that extends through the vias 136 provides additional support of the roof of the cavity 138 and helps maintain the structural integrity of the device by preventing the device from breaking apart from the electrical contacts 104 when the device moves within the cavity in response to an electrical bias applied to either the pull-in electrodes 108, 110 or the pull-off electrode 134. When a bias is applied to either the pull-in electrodes 108, 110 or the pull-off electrode, the device moves either closer to or further away from the RF electrode 112. A great deal of stress may be placed on the device at the connection to the electrical contacts 104, 106. The sealing material 140, because it is connected to the second insulating layer 122, reduces the stress by shifting the location where the greatest stress occurs to a location spaced from the electrical contacts 104, 106.

It is to be understood that while the thin layer of material that has a lower recombination coefficient as compared to the cantilever structure has been discussed as being deposited over the cantilever structure, it is contemplated that the thin layer could be deposited such that the thin layer is also under the cantilever structure or even encapsulating the cantilever structure. It is also contemplated to add release holes at locations corresponding to each sacrificial layer to increase the etching rate. The advantages of utilizing the top release holes and by depositing the insulating material over the exposed metal surfaces include faster etching that translates into lower over etch gradient through the free-standing element and higher throughput and lower manufacturing cost.

While the foregoing is directed to embodiments of the present invention, other and further embodiments of the invention may be devised without departing from the basic scope thereof, and the scope thereof is determined by the claims that follow.

The invention claimed is:

1. A method, comprising:
depositing a first insulating layer over a substrate;
etching the first insulating layer to expose at least a portion of the substrate and form a via;
depositing a first sacrificial layer over the first insulating layer;
etching the first sacrificial layer to at least partially define outer boundaries for a cavity to be formed and to expose the substrate through the via;
depositing a structural layer on the substrate and on the first sacrificial layer, the structural layer comprising a material having a first recombination coefficient;
depositing a second insulating layer on the structural layer, the second insulating layer comprising a material having a second recombination coefficient that is lower than the first recombination coefficient;
etching the second insulating layer and the first structural layer to at least partially define a shape of a cantilever device and a outer boundaries of the cavity, and to expose at least a portion of the first sacrificial layer;
depositing a second sacrificial layer on the first sacrificial layer and on the second insulating layer;
etching the second sacrificial layer such that the first sacrificial layer and the second sacrificial layer collectively define the shape of the cavity to be formed;
depositing a third insulating layer over the second sacrificial layer;
depositing an electrode layer on the third insulating layer;
depositing an encapsulating layer on the electrode layer;
etching an opening in the encapsulating layer;
introducing an etchant through the opening; and
etching the first sacrificial layer and the second sacrificial layer to remove the first sacrificial layer and the second sacrificial layer, to form the cavity and free the cantilever device to move within the cavity.

2. The method of claim 1, further comprising depositing a filling material through the opening and onto the second insulating layer, the filling material extending from the second insulating layer through the opening.

3. The method of claim 1, wherein etching the first sacrificial layer and the second sacrificial layer comprises completing the etching process for the second sacrificial layer prior to completing the etching process for the first sacrificial layer.

4. The method of claim 1, wherein etching an opening in the encapsulating layer comprises etching the opening through the encapsulating layer such that the opening is linearly aligned with the via.

5. The method of claim 1, wherein depositing the structural layer comprises depositing structural layer selected from the group consisting of a titanium aluminum nitride layer and a titanium nitride layer.

6. The method of claim 5, wherein depositing the second insulating layer comprises depositing silicon nitride or silicon oxide.

7. The method of claim 1, wherein depositing the first insulating layer, depositing the second insulating layer and depositing the third insulating layer each comprise depositing silicon nitride or silicon oxide.

8. The method of claim 1, wherein the structural layer is a first structural layer, the method further comprising:
   etching vias through the second sacrificial layer to expose the second insulating layer;
   depositing structural posts within the vias;
   depositing a second structural layer over the second sacrificial layer and the structural posts;
   depositing a fourth insulating layer over the second structural layer; and
   etching the fourth insulating layer and the second structural layer to further define the shape of the cantilever device and the outer boundaries of the cavity.

9. A method, comprising:
   depositing a first sacrificial layer over a substrate;
   removing material from the first sacrificial layer to form a via and expose at least a portion of the substrate;
   forming a cantilever structure over the first sacrificial layer and within the via;
   depositing a second sacrificial layer over the cantilever structure;
   depositing an encapsulating layer over the second sacrificial layer, first sacrificial layer and the substrate to form at least a portion of a cavity boundary;
   removing at least a portion of the encapsulating layer to expose the second sacrificial layer and form an opening that is axially aligned with the via;
   introducing an etching gas to the second sacrificial layer through the opening; and
   etching the second sacrificial layer and the first sacrificial layer to form a cavity and free the cantilever structure within the cavity.

10. The method of claim 9, wherein forming the cantilever structure comprises:
    depositing a first layer comprising a first material having a first recombination coefficient; and
    depositing a second layer on the first layer, the second layer comprising a material that has a second recombination coefficient that is lower than the first recombination coefficient.

11. The method of claim 10, wherein depositing the first layer comprises depositing a layer selected from the group consisting of titanium nitride and titanium aluminum nitride.

12. The method of claim 11, wherein depositing the second layer comprises depositing a silicon nitride or a silicon oxide layer.

13. The method of claim 9, further comprising depositing a material on the cantilever structure by introducing the material through the opening.

14. The method of claim 9, further comprising depositing a sealing layer over the encapsulating layer after etching the second sacrificial layer and etching the first sacrificial layer, wherein the sealing layer extends through the opening and onto the cantilever structure.

15. The method of claim 9, wherein forming the cantilever structure comprises:
    depositing a first structural layer over the first sacrificial layer;
    depositing a first insulating layer over the first structural layer;
    etching the first insulating layer and the first structural layer to at least partially define the shape of the cantilever device and the outer boundaries of the cavity and to expose at least a portion of the first sacrificial layer;
    depositing a third sacrificial layer over the first insulating layer and the exposed first sacrificial layer;
    etching vias through the second sacrificial layer to expose the first insulating layer;
    forming posts within the vias and on the first insulating layer;
    depositing a second structural layer on the posts and the third sacrificial layer;
    depositing a second insulating layer on the second structural layer;
    etching the second insulating layer and the second structural layer to further define the shape of the cantilever device and the outer boundaries of the cavity; and
    depositing the second sacrificial layer over the second insulating layer.

* * * * *